United States Patent
Gregoire

(10) Patent No.: US 9,257,291 B2
(45) Date of Patent: Feb. 9, 2016

(54) METHOD FOR FORMING A SILICIDE LAYER AT THE BOTTOM OF A HOLE AND DEVICE FOR IMPLEMENTING SAID METHOD

(75) Inventor: Magali Gregoire, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 631 days.

(21) Appl. No.: 13/607,345

(22) Filed: Sep. 7, 2012

(65) Prior Publication Data

US 2013/0065392 A1    Mar. 14, 2013

(30) Foreign Application Priority Data

Sep. 7, 2011    (FR) ...................................... 11 57912

(51) Int. Cl.
*H01L 21/4763*    (2006.01)
*H01L 21/285*    (2006.01)
*H01L 21/768*    (2006.01)

(52) U.S. Cl.
CPC .... *H01L 21/28518* (2013.01); *H01L 21/76814* (2013.01); *H01L 21/76865* (2013.01)

(58) Field of Classification Search
None
See application file for complete search history.

(56) References Cited

U.S. PATENT DOCUMENTS

| | | | | |
|---|---|---|---|---|
| 5,725,739 | A | * | 3/1998 | Hu .......................... C23C 14/046 204/192.17 |
| 6,110,821 | A | * | 8/2000 | Kohara ................. C23C 14/185 257/E21.165 |
| 6,143,377 | A | | 11/2000 | Miyamoto |
| 2003/0236003 | A1 | | 12/2003 | Koo et al. |
| 2004/0115921 | A1 | * | 6/2004 | Clevenger et al. ............ 438/622 |
| 2005/0014365 | A1 | | 1/2005 | Moon et al. |
| 2011/0117738 | A1 | | 5/2011 | Russell et al. |

FOREIGN PATENT DOCUMENTS

EP    0 214 515 A2    3/1987

* cited by examiner

*Primary Examiner* — Calvin Choi
(74) *Attorney, Agent, or Firm* — Seed IP Law Group PLLC

(57) ABSTRACT

A method for manufacturing a silicide layer in a hole formed across the entire thickness of a layer of a material deposited on a silicon layer, including: a first step of bombarding of the hole with particles to sputter the silicon at the bottom of the hole and deposit sputtered silicon on lateral walls of the hole; a second step of deposition in the hole of a layer of silicide precursor; a second step of bombarding of the hole with particles to sputter the silicon precursor at the bottom of the hole and deposit sputtered precursor on the internal walls of the hole; a second step of deposition in the hole of a layer of silicide precursor; and an anneal step to form a silicide layer in the hole.

11 Claims, 3 Drawing Sheets

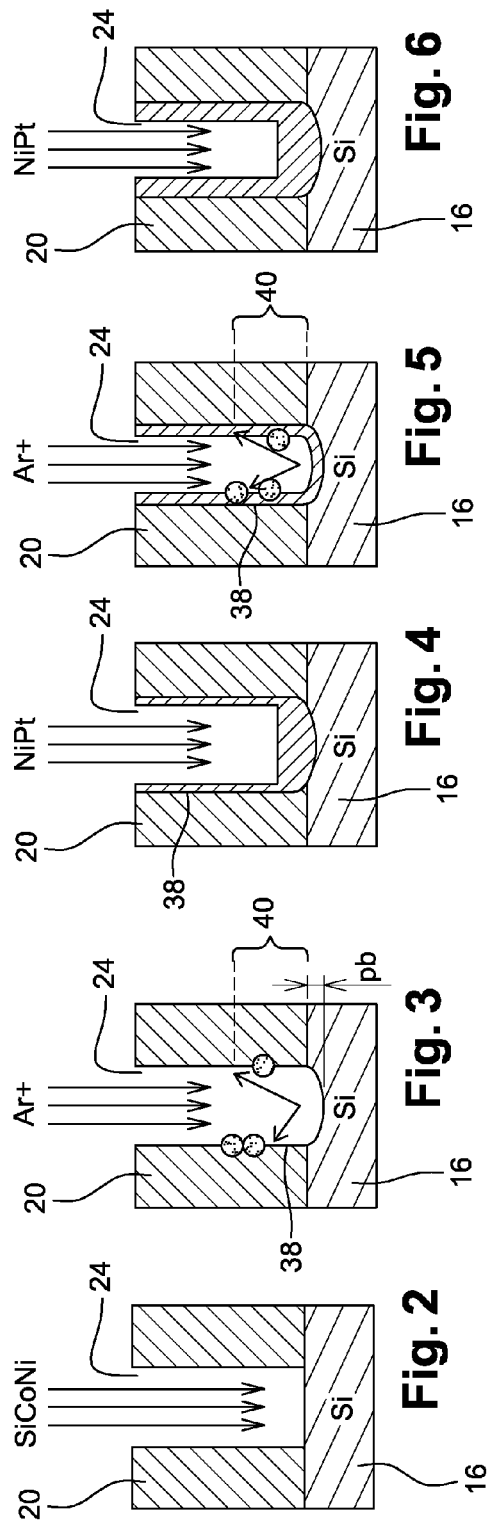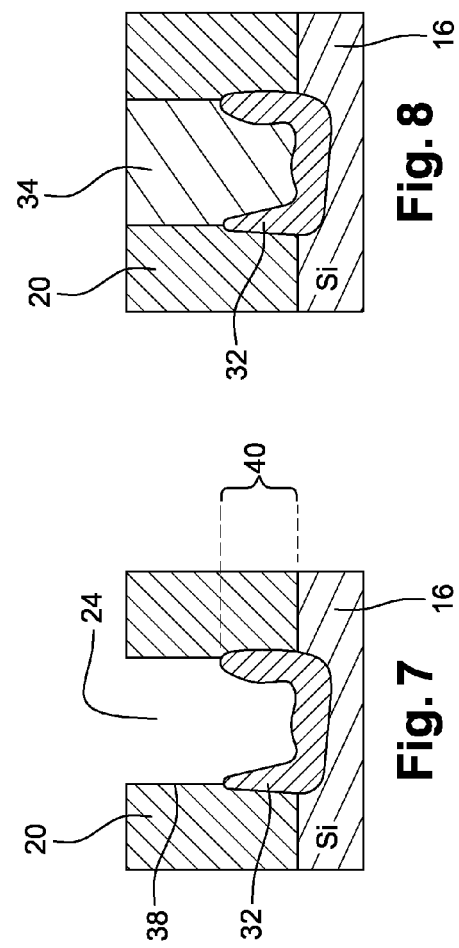

METHOD FOR FORMING A SILICIDE LAYER AT THE BOTTOM OF A HOLE AND DEVICE FOR IMPLEMENTING SAID METHOD

BACKGROUND

1. Technical Field

The present disclosure relates to integrated circuit manufacturing, and more specifically to the manufacturing of trenches emerging on a silicon layer and having at least their bottom coated with silicide.

2. Description of the Related Art

Silicide is a compound comprising silicon and electropositive atoms, such as for example monosilicides like (Pt, Ni, Ir)Si, or metal-rich phases like (Pd, Mg, Ca)$_2$Si or (Co, Ti, Ru, Cr, Er)Si$_2$.

Nickel silicide (NiSi) is a material especially used to form an ohmic contact between the silicon and a metal. For example, nickel silicide is interposed between the silicon of a source and of a drain of a MOS transistor and metal contacts forming the transistor terminals, which results in decreasing the resistance of access to the source and to the drain and in providing a better ohmic contact.

Usually, nickel silicide is obtained by bringing together platinum nickel (NiPt) and silicon and by performing an anneal which forms the nickel silicide.

The quality of the ohmic contact especially depends on the nickel silicide volume between the silicon and the metal contact, on the presence of impurities and of residue between these different materials and on the contact surface area between the different materials.

Some advanced CMOS technology transistor manufacturing methods, especially methods for manufacturing transistors having a gate width equal to or smaller than 28 nanometers, form silicide at the bottom of holes or trenches emerging on the drain and source areas ("Hole salicide").

Now, the forming of holes generally is a source of impurities and of residue, mainly located at their bottom. Further, the forming of a nickel silicide layer having both a large volume and a large surface area at the bottom of the holes is more difficult as the form factor of the holes, that is, the ratio of the depth to their cross-section, increases.

BRIEF SUMMARY

One or more embodiments of the present disclosure is to provide a method enabling to obtain a silicide layer in a hole, especially in the low portion thereof, which provides a good subsequent ohmic contact, even in the presence of a hole having a high form factor.

An embodiment of the present disclosure relates to a method for manufacturing a silicide layer in a hole formed across the entire thickness of a layer of a material deposited on a silicon layer, comprising:
- a first step of bombarding of the hole with particles to sputter the silicon at the bottom of the hole and deposit sputtered silicon on lateral walls of the hole;
- a first step of deposition in the hole of a layer of silicide precursor alloy;
- a second step of bombarding of the hole with particles to sputter the silicon precursor at the bottom of the hole and deposit sputtered precursor on the internal walls of the hole;
- a second step of deposition in the hole of a layer of silicide precursor; and
- an anneal step to form a nickel silicide layer at the bottom of the hole.

"Silicide precursor" refers to electropositive atoms and molecules forming a silicide, such as monosilicides like (Pt, Ni, Ir)Si, or metal-rich phases like (Pd, Mg, Ca)$_2$Si or (Co, Ti, Ru, Cr, Er)Si$_2$. A silicon precursor for example is an elements from among Pt, Ni, Ir, Pd, Mg, Ca, Co, Ti, Ru, Cr, and Er, or an alloy of two or several of these elements.

The first bombarding step thus results in cleaning the bottom of the hole of possible impurities and residue, of hollowing the silicon layer, which increases the free silicon surface area, and of depositing silicon on the lateral wall of the hole.

The deposition of an alloy to form silicide is generally performed according to a physical vapor deposition method, or PVD. Such a method generally does not enable to deposit a thick layer of material on the lateral wall of a hole, and this all the more as the hole has a large form factor. For example, for a cylindrical hole having a 75-nanometer depth for a cross-section with a 20-nanometer diameter, substantially no silicide precursor is deposited on the lateral hole wall. The silicide precursor is essentially present at the bottom of the hole.

The second bombarding step results in sputtering the silicide precursor present at the bottom of the hole, which then deposits back on the lateral wall. The second deposition step once again deposits silicide precursor at the bottom of the hole, so that the hole, at least on its low portion, is entirely coated with silicide precursor.

The anneal step then forms a silicide layer at the bottom of the hole, since silicide precursor is in contact with silicon. The silicide due to the present disclosure is also formed on the lateral wall of the hole, at least on the low portion thereof, since silicon has been deposited on the hole sides after the first bombarding step and silicide precursor has been deposited on the hole sides after the second bombarding step.

A silicide layer of large thickness, having a large surface area of contact with the silicon layer and itself having a large contact surface area, for example, for a subsequent metal contact, is thus obtained.

An embodiment of the present disclosure relates to the use of a device for forming silicide precursor at the bottom of a hole formed across the entire thickness of a layer of a material deposited on a silicon layer, the device comprising:
- a tight enclosure associated with a pumping circuit for controlling the pressure therein and a controllable circuit for supplying the enclosure with at least one inert gas, especially argon;
- a first electrode capable of receiving a target made of a silicide precursor alloy;
- a second electrode, arranged under the first electrode, capable of receiving a component to be submitted to the cathode sputtering deposition; and
- a controllable electric circuit for powering the first and second electrodes,
- a circuit for controlling the power supply circuit and the electric circuit for setting the argon flow rate in the enclosure and for setting the electric voltages and power applied to the first and second electrodes, wherein the control circuit is capable of controlling the electric power supply circuit according to at least one bombarding mode in which an inert gas plasma is generated and the positive ions of the plasma are accelerated towards the second electrode, and a cathode sputtering deposition mode wherein an inert gas plasma is generated and the plasma ions are accelerated towards the first electrode, and wherein the forming of the silicide precursor layer in the hole comprises:

the placing of the hole in the tight enclosure between the two electrodes with the hole facing the first electrode; and the successive application of two cycles, each comprising an application of the first bombarding mode followed by an application of the second bombarding mode.

BRIEF DESCRIPTION OF THE DRAWINGS

The foregoing and other features and advantages of the present disclosure will be discussed in detail in the following non-limiting description of specific embodiments in connection with the accompanying drawings, where the same reference numerals designate the same or similar elements.

FIGS. 2 to 8 are simplified cross-section views of an embodiment of a nickel silicide layer at the bottom of a hole according to an embodiment of the present disclosure.

DETAILED DESCRIPTION

Figure 1:
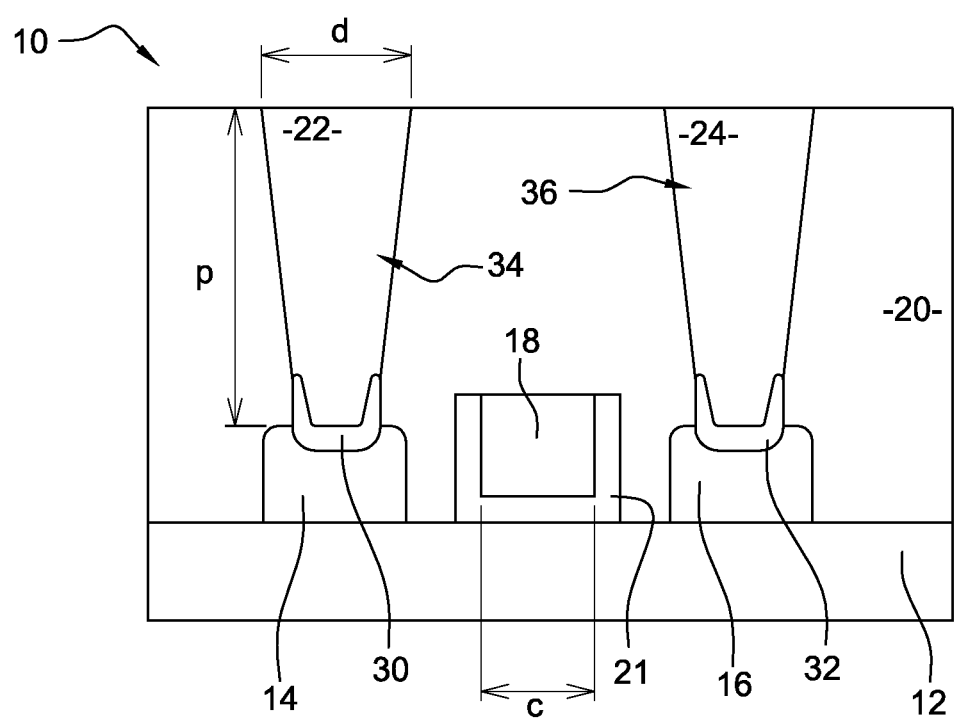
FIG. 1 is a simplified cross-section view of a MOS transistor to which the present disclosure is applied.

FIG. 1 is a cross-section view schematically showing an example of a MOS transistor 10 comprising a silicon substrate (Si) 12 having two raised silicon epitaxy areas 14, 16 respectively forming the source and the drain of transistor 10 formed thereon. A metal gate electrode 18 is further provided between drain 14 and source 16, the source, the drain, and the gate being formed in an insulator layer 20 arranged on substrate 12. Metal gate 18 is further surrounded with an insulating layer 21.

Two holes 22, 24 are formed in a block of insulating material 20, arranged above drain 14 and source 16 to provide access thereto. Finally, the bottom of holes 22, 24 comprises a silicide layer 30, 32 forming an interface between the silicon of the source and of the drain and a metallic material 34, 36 filling holes 22, 24 and forming the source and drain electrodes.

As a numerical example of one embodiment, width c of the gate is equal to 28 nanometers, depth p of holes 22, 24 is equal to 75 nanometers, and width d of holes 22, 24 is equal to 20 nanometers.

An embodiment of a method according to the present disclosure, for example applied to the forming of silicide layers 30, 32 in holes 22, 24 of transistor 10 of FIG. 1, will now be described in relation with FIGS. 2 to 8. FIGS. 2 to 8 schematically illustrate in cross-section view one hole only, for example, hole 24, formed in insulating region 20.

The method starts with a pre-cleaning of hole 24 to deoxidize surfaces in the hole, including the silicon surface at the bottom of hole 24 (FIG. 2). For example, the pre-cleaning is a remote plasma reactive etching. This processing comprises etching the surface layer made of oxide or possibly of silicon nitride to enable the subsequent forming of silicides in this area. This etching is advantageously performed in the same frame as the deposition chamber subsequently used to perform depositions such as described hereinafter, that is, with no high-vacuum loss to avoid the reoxidation of the surface silicon.

The method then continues with a first step of bombarding with particles, advantageously Ar+ ions which sputter the bottom of hole 24, thus removing the residue and impurities which may possibly be present, while etching silicon layer 16, for example down to a depth pb of a few nanometers and in one embodiment, smaller than 10 nanometers. The sputtered silicon then redeposit on lateral wall 38 of hole 24, and especially on low portion 40 of lateral wall 38 (FIG. 3). The etch residue of hole 24 is most often formed of volatile fluorinated compounds. Under the bombarding, these compounds are desorbed, and then pumped out.

A silicide precursor, for example, a nickel and platinum alloy, is then deposited for a first time into hole 24 (FIG. 4). As illustrated, the alloy layer thickness on lateral wall 38 of hole 24 is very small, that is, on the order of a few nanometers for a hole of high form factor, most of the alloy depositing at the bottom of hole 24.

The method then continues with a second bombarding step, which may, for example, be identical to the first bombarding step, to sputter the alloy located at the bottom of hole 24 (FIG. 5). The sputtered alloy then deposits on lateral wall 38 of hole 24, and especially on low portion 40 of lateral wall 38.

A second alloy deposition, which may, for example, be identical to the first deposition or relating to a second type of silicide precursor, is deposited on the bottom of hole 24 with alloy (FIG. 6).

The method then continues with the forming of silicide, especially at the bottom of hole 24, for example, by performing an anneal at a temperature ranging between 150° C. and 400° C. for a time ranging between 10 seconds and 60 seconds (FIG. 7).

As illustrated in FIG. 7, a silicide layer is formed at the bottom of the hole across the very thickness of silicon epitaxy layer 16 and also on lateral wall 38, at least in its low portion 40. As an example, the thickness of the silicide layer at the bottom of the hole ranges between 6 nanometers and 25 nanometers.

By filling hole 24 with metal 34 (FIG. 8), for example, to form an electric contact with the drain or the source, it can be noted that there also is a large surface area of contact with the silicide layer.

Advantageously, the anneal implemented to form silicide has substantially no effect on the alloy from the moment that the latter is not in contact with silicon, and the nickel-based alloy depositions are "full wafer", that is, they can be performed over the entire silicon wafer. A selective chemical cleaning step enables to remove the alloy which has not reacted with silicon, without removing the silicide. The advantages of a self-aligned silicide manufacturing, or "salicide" are thus obtained.

It is to be appreciated that various steps of the method may be performed sequentially, in parallel, omitted or in an order different from the order that is presented.

Figure 9:
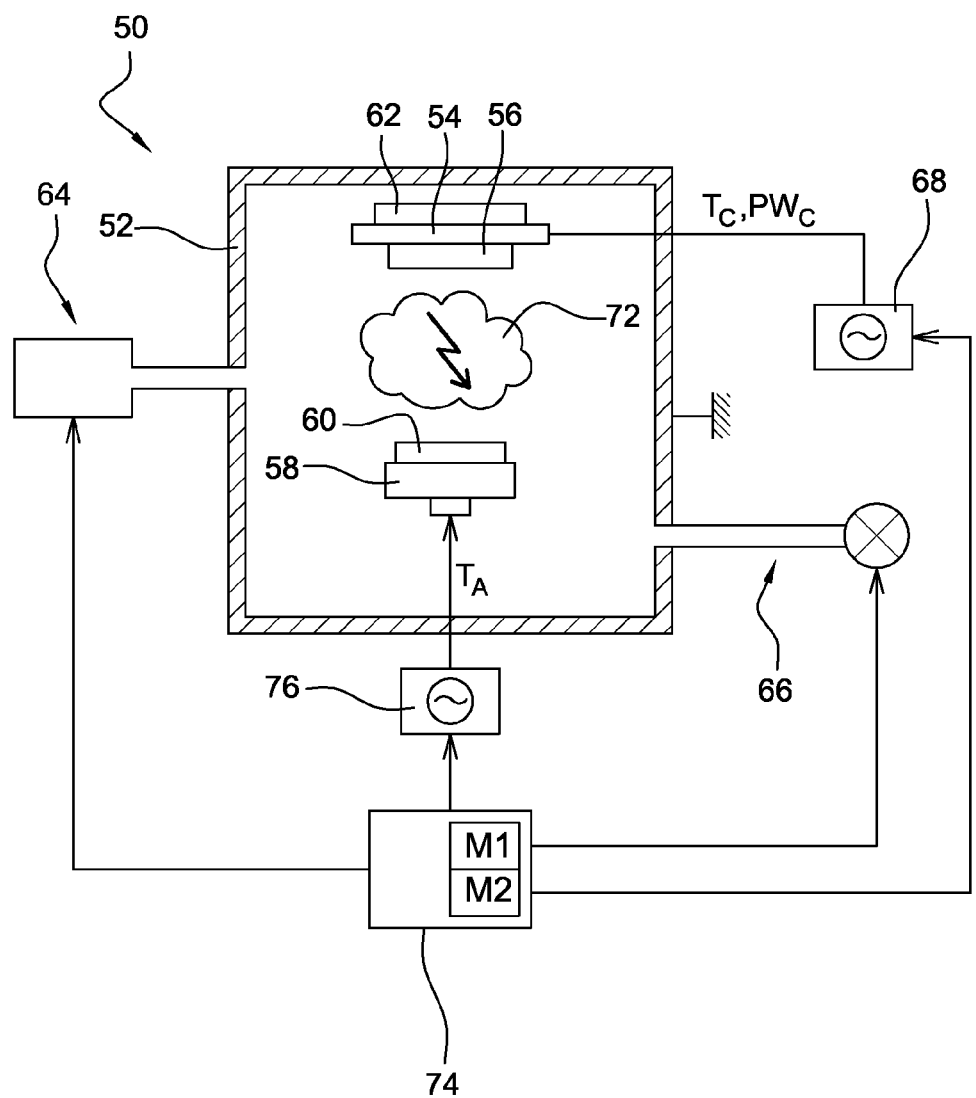
FIG. 9 is a simplified view of a device used at certain steps of the manufacturing of a nickel silicide layer at the bottom of a hole according to an embodiment of the present disclosure.

FIG. 9 schematically illustrates an example of a device 50 capable of implementing the steps corresponding to FIGS. 3 to 6 of the method according to the present disclosure.

Device 50 comprises a tight enclosure 52 in which are placed a first conductive electrode 54, whereon a target 56 formed of a material to be deposited may be attached by any suitable means, and a support 58, placed under electrode 54, for receiving a component 60 whereon the deposition is performed. Electrode 54 and support 58 are for example spaced apart by 20 centimeters.

First electrode 54 comprises on its upper surface a rotating magnet 62, for example, permanent, or one or several coils, to create a magnetic field at least in the vicinity of target 56.

Enclosure 52 is further supplied with a gas adapted to cathode sputtering, advantageously inert, and especially argon Ar due to its high atomic mass and to its capacity of being easily ionized, this supply being performed by means of a controllable supply circuit 64 comprising a gas feed duct and a unit for controlling the volume or mass flow rate in enclosure 52. Said enclosure also communicates with a pumping circuit 66 which controls the gas pressure within enclosure 52.

Device 50 also comprises a controllable electric power supply circuit 68 electrically connected to first electrode 54 to submit it to a positive voltage $T_C$ and an electric power $PW_C$. The frame of enclosure 52 is placed at the potential of ground 69 and is electrically isolated from first electrode 54, so that voltage $T_C$ creates a plasma 72 at the center of enclosure 52.

Device 50 comprises a control circuit 74 connected to supply circuit 64, to pumping circuit 66, and to power supply circuit 68 to respectively provide them with respective instructions relative to the gas flow rate, the pressure in the enclosure, and the electric voltage and power on electrode 56, respectively.

Under the effect of the power supply of first electrode 54, the gas present in the enclosure ionizes, thus creating a plasma 72 comprising ions, for example, $Ar^+$. The ions are directed and accelerated towards target 56 due to the electric field. These ions tear off molecules or atoms from target 56. Such torn-off molecules or atoms then deposit on component 60. The function of the magnetic field created by a magnet at the rear surface of the target is to confine the plasma in the vicinity of the target and thus to increase the intensity of its bombarding.

The above-mentioned elements are conventional and, for example, are elements constitutive of a cathode sputtering device such as currently used in microelectronics. It should more generally be noted that any known cathode sputtering device with suitable modifications that are detailed hereinafter may implement the present disclosure.

Support 58 is electrically conductive and electrically isolated from the frame of enclosure 52, and device 50 comprises a second controllable power supply circuit 76 electrically connected to support 58, which thus forms a second electrode. The application of an adapted radio frequency voltage to component 60, via support 58 and through an RF tuning box, not shown, will negatively bias component 60 and its support 58 with respect to the enclosure and to the plasma. This phenomenon of self-biasing by application of a radio frequency voltage is well known by those skilled in the art since it is very widely used in microelectronics manufacturing equipment, to etch or clean substrate wafers with a plasma, and is currently called DC bias. An acceleration of the positive Ar+ ions to bombard components 60 is thus obtained. The second power supply circuit 76 is further connected to control circuit 74 from which it receives voltage and power instructions.

Control circuit 74 is capable of controlling gas flow supply circuit 64 and the two power supply circuits 68 and 76 according to at least two predetermined modes M1 and M2, described hereinafter, which respectively implement the bombarding step and the deposition step such as described previously, for example.

More specifically, to implement said steps, a target 56 formed of a silicide precursor, for example, nickel platinum, is placed under electrode 54, and component 60 to which the method according to the present disclosure is applied is placed on support 58, possibly after a pre-cleaning step such as for example described in relation with FIG. 2 if such an optional step is implemented.

To implement the bombarding of component 60 for Ar+ ions, control circuit 74 sets the operating parameters of device 50 according to mode M1 as follows:
- a mass flow rate of argon Ar between electrode 54 and support 58 ranging between 1 sccm and 5 sccm ("standard cubic centimeters per minute"), that is, one cubic centimeter per minute under so-called standard conditions of 25° C. and 101,325 Pa; the resulting pressure in the enclosure ranges between 0.2 mTorr and 1 mTorr;
- a positive D.C. component of voltage $T_C$ applied to first electrode 54 ranging between 0 volts and 20 volts. Preferably, the D.C. component of voltage $T_c$ is set to 0 volt;
- an A.C. component of voltage $T_C$ applied to first electrode 54 having an electric power $PW_C$ smaller than 0.5 watt; and
- an A.C. component of voltage $T_A$ applied to support 58 usually having a 13.56-hertz frequency, for an electric power $PW_A$ ranging between 200 watts and 800 watts, for example, 400 watts; this results in the forming of an argon plasma in the enclosure and in the occurrence of a negative self-bias voltage, for example on the order of −250V, at the level of support 58.

To implement the deposition of silicide precursor on component 60, for example, a nickel platinum alloy, control circuit 74 sets the operating parameters of device 50 according to mode M2 as follows:
- a mass flow rate of argon Ar between electrode 54 and support 58 ranging between 10 sccm and 50 sccm; the resulting pressure in the enclosure ranges between 0.8 mTorr and 5 mTorr;
- if device 50 is equipped with a second source of Ar delivered within support 58 enabling to well maintain component 60 on support 58, the mass flow rate of argon Ar internal to support 58 ranges between 1 sccm and 5 sccm, for example 5 sccm.
- a negative D.C. component of voltage $T_C$ applied to first electrode 54 ranging between 0 volts and −500 volts for an electric power ranging between 200 watts and 1,500 watts, for example, 1,000 watts;
- an A.C. component of voltage $T_C$ applied to electrode 54 having an electric power ranging between 200 watts and 800 watts, for example, 400 watts; and
- a zero voltage $T_A$ applied to support 58.

The steps of bombarding and deposition are, for example, each carried out for a time period shorter than 100 seconds, for example, 50 seconds.

In the foregoing embodiment, the bombarding of the target and of the component are performed by means of argon ions, which make these two types of bombarding possible due to the high atomic mass of argon and to its capacity of being easily ionized. Alternatively or in addition, other gases may be used. It may also be envisaged to couple another gas flow, such as for example, nitrogen with a low partial pressure.

Of course, the present disclosure is likely to have various alterations, modifications, and improvements which will readily occur to those skilled in the art. Such alterations, modifications, and improvements are intended to be part of this disclosure, and are intended to be within the spirit and the scope of the present disclosure. Additionally, the various embodiments described above can be combined to provide further embodiments. Accordingly, the foregoing description is by way of example only and is not intended to be limiting. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method comprising:
 sputtering silicon at a bottom of a hole and depositing sputtered silicon on lateral walls of the hole by bombarding the silicon with particles;

depositing a first layer of silicide precursor in the hole;

sputtering the first layer of silicide precursor at the bottom of the hole and depositing sputtered silicon precursor on the lateral walls of the hole by bombarding the silicide precursor with particles;

depositing a second layer of silicide precursor in the hole; and forming a silicide layer in the hole by annealing the sputtered silicon, the sputtered silicide precursor, and the second layer of silicide precursor.

2. The method of claim 1, wherein the bombarding steps include bombarding with argon ions $Ar^+$.

3. The method of claim 1, wherein the depositing steps include cathode sputtering.

4. The method of claim 3, wherein cathode sputtering uses an argon plasma.

5. The method of claim 1, wherein the first and second layers of silicide precursor include at least one of Pt, Ni, Ir, Pd, Mg, Ca, Co, Ti, Ru, Cr, and Er.

6. A method comprising:

placing a substrate having a hole in an enclosure between a first and second electrode, the hole facing the first electrode;

flowing inert gas into the enclosure;

accelerating first positive ions towards the hole and sputtering silicon from a bottom surface of the hole;

accelerating first plasma ions towards the first electrode that cause the sputtered silicon to deposit on lateral walls of the hole;

depositing a first layer of silicide precursor in the hole;

accelerating second positive ions towards the hole that sputter silicide precursor from the hole;

accelerating second plasma ions towards the first electrode that cause the sputtered silicide precursor to deposit on the lateral walls of the hole;

depositing a second layer of silicide precursor in the hole; and forming a silicide layer by annealing the first and second layers of silicide precursor in the hole.

7. The method of claim 6, wherein accelerating positive ions towards the first electrode comprises:

flowing inert gas into the chamber at approximately 1 to 5 sccm; and applying biasing voltages between the first and second electrodes.

8. The method of claim 6, wherein the inert gas is argon.

9. The method of claim 6, wherein the first and second layers of silicide precursor includes at least one of Pt, Ni, Ir, Pd, Mg, Ca, Co, Ti, Ru, Cr, and Er.

10. The method of claim 6, wherein forming silicide layer by annealing comprises annealing at a temperature between approximately 150° C. and 400° C.

11. The method of claim 10, wherein annealing comprises annealing for between approximately 10 to 60 seconds.

* * * * *